United States Patent [19]

McCaslin et al.

[11] Patent Number: 4,999,798
[45] Date of Patent: Mar. 12, 1991

[54] TRANSIENT FREE INTERPOLATING DECIMATOR

[75] Inventors: Shawn R. McCaslin, Cedar Creek; Nicholas R. van Bavel, Austin, both of Tex.

[73] Assignee: Motorola, Inc., Schaumburg, Ill.

[21] Appl. No.: 486,694

[22] Filed: Mar. 1, 1990

[51] Int. Cl.$^5$ .............................................. G06F 15/31
[52] U.S. Cl. .................................................. 364/724.1
[58] Field of Search ............ 364/724.01, 724.1, 724.13

[56] References Cited

U.S. PATENT DOCUMENTS

| | | | |
|---|---|---|---|
| 4,835,723 | 5/1989 | Hansen | 364/724.1 X |
| 4,872,129 | 10/1989 | Pfeifer et al. | 364/724.1 |
| 4,881,191 | 11/1989 | Morton | 364/724.1 X |

Primary Examiner—Gary V. Harkcom
Assistant Examiner—Tan V. Mai
Attorney, Agent, or Firm—Robert L. King

[57] ABSTRACT

A transient-error free interpolating decimator utilizes only two comb filters. The decimator has an integrator circuit, which receives a digitized signal at a first clock rate, and a differentiator circuit. The differentiator includes first and second comb filters for down converting the digital signal at the first clock rate to a second clock rate, and for providing sample points at first and second outputs; the differentiator circuit and the integrator circuit comprise a decimation filter. A delay circuit provides coarse sampling phase adjustments by delaying the second clock rate by a predetermined number of first-clock cycles. A counter generates the second clock rate and provides coarse sampling phase adjustments by adding or deleting cycles of the first clock to or form the second clock. A multiplexer circuit swaps the two outputs when necessary to prevent transient errors generated in the differentiators from being observed. An interpolator circuit makes fine sampling phase adjustments by interpolation to provide an output that is transient-error free. The interpolator circuit includes a bypass circuit for bypassing the first output of the multiplexer circuit for preventing transient errors from being observed.

6 Claims, 6 Drawing Sheets

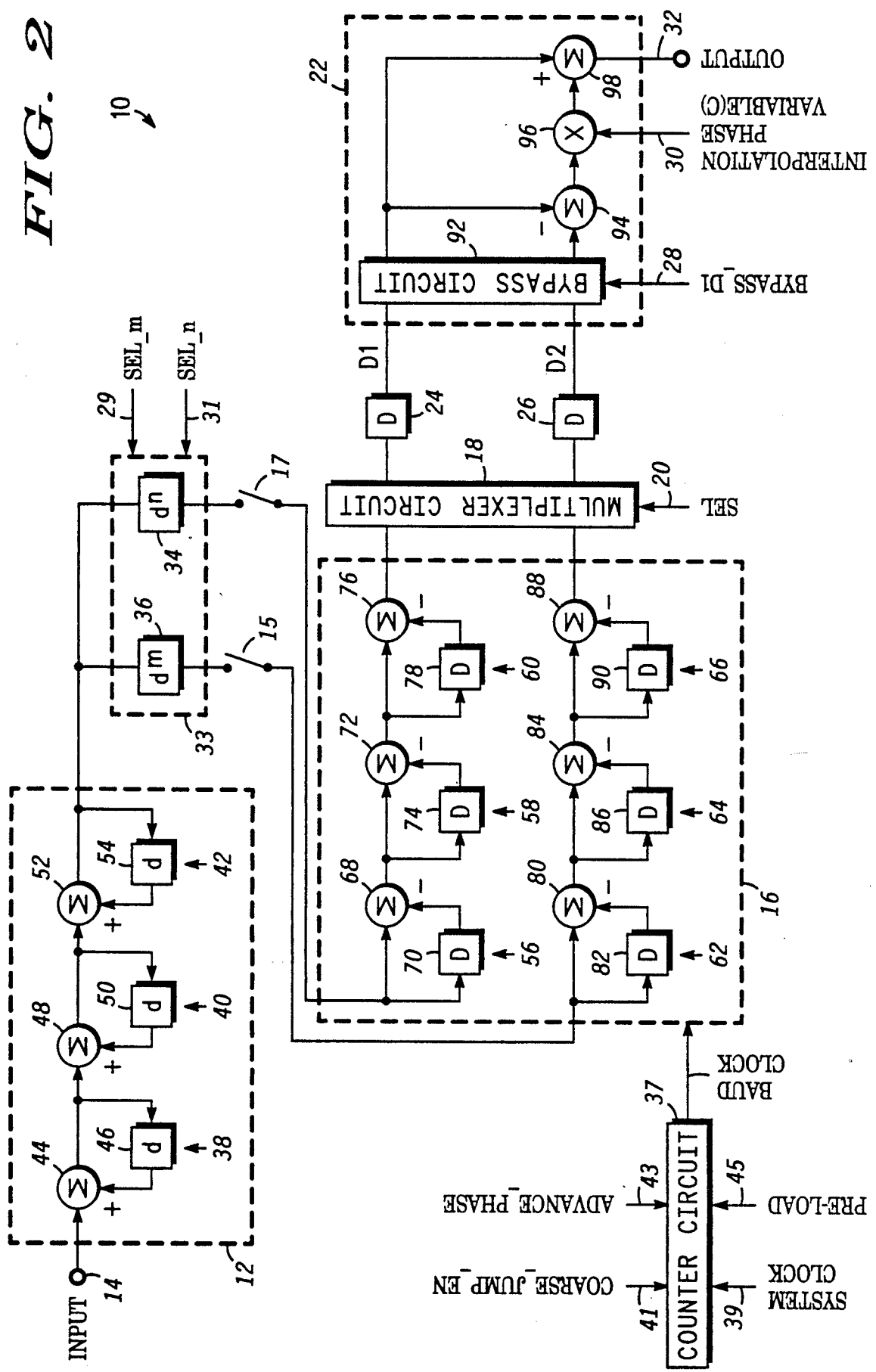

↑ = ACTUAL SAMPLING TIME

↟ = ANTICIPATED DESIRED SAMPLING TIME

↑ = ACTUAL SAMPLING TIME

↟ = ANTICIPATED DESIRED SAMPLING TIME

↑ = ACTUAL SAMPLING TIME

↟ = ANTICIPATED DESIRED SAMPLING TIME

↑ = ACTUAL SAMPLING TIME

↟ = ANTICIPATED DESIRED SAMPLING TIME

TRANSIENT FREE INTERPOLATING DECIMATOR

TECHNICAL FIELD

This invention pertains to decimation and, in particular, to oversampled data converters that require a high phase resolution.

BACKGROUND OF THE INVENTION

Typical sima/delta analog-to-digital converters have a modulator for digitizing a received analog signal and a low pass filter for filtering and decimation. The low pass filter may include an integrator circuit which usually operates at a high system clock frequency and a differentiator circuit which samples down the system clock to a much lower frequency, typically called the baud rate clock. Furthermore, an interpolator circuit can be utilized to provide increased time resolution between two sample points from the differential by a well known method called interpolation.

Typically, two comb filters are used in the differentiator circuit for generating the sampling points that are sent to the interpolator circuit. Typical sampling points are illustrated in the top portion of FIG. 1, where the short vertical arrows indicate sampling points generated from one comb filter, and the long vertical arrows indicate sampling points generated from the other comb filter, whereby the sampling phase of each of the comb filters differs by one system clock cycle as shown. Furthermore, the time between two adjacent sampling points from the same comb filter is the baud period as shown. Coarse sampling phase adjustments are performed by adding or deleting cycles of the system clock to the baud-rate clock. A coarse phase jump is illustrated in the bottom portion of FIG. 1, whereby an advanced coarse jump is made as shown, since the interval of interpolation is one system clock cycle ahead of its previous interval. The other possible jump that could have been made is a retard coarse phase jump, whereby the interval of interpolation is one system clock cycle behind its previous interval.

Fine sampling phase adjustments, that is, phase adjustments which are smaller than the original sampling period (system clock periods) are performed by linearly interpolating between pairs of sampling points (intervals) from the two comb filters. Therefore, the sampling phase is adjusted by simply changing the scale factor in an interpolation equation, as is well known in the art. The main problem with this system, however, is that immediately after a coarse phase jump is made, the comb filters inherently produce a large transient error that will be transmitted to the output of the interpolator circuit. These transient errors exist until the effect of the coarse phase jump has been shifted through the delay elements of the comb filters.

One obvious and simple solution for avoiding transient errors at the output of the interpolation is to utilize a third comb filter. This approach involves adjusting the sampling phase of the third comb filter to the nextanticipated coarse phase jump while the output of the interpolator can then use the third comb filter, along with either the first or second comb filters, to perform interpolation over a new interval, thereby eliminating any transient errors occurring at the output of the interpolator. The three comb filter method is effective, but it is not efficient as a two comb filter approach since comb filters are typically large and expensive to implement.

Thus, a need exists for providing an interpolating decimator with increased resolution while utilizing only two comb filters in the differentiator circuit.

SUMMARY OF THE INVENTION

Accordingly, it is an object of the present invention to minimize the number of comb filters required in a digital low pass filter to avoid transient errors at the output of an interpolator.

Another object of the present invention is to provide an efficient transient-error free interpolating decimator.

Still another object of the present invention is to provide an improved transient-error free interpolating decimator utilizing only two comb filters.

In carrying out the above and other objects of the present invention, there is provided a transient-error free interpolating decimator utilizing only two comb filters, comprising an integrator circuit for receiving a digital input signal at a first clock rate; a differentiator circuit coupled to the integrator circuit which includes first and second comb filters for down converting the digital input signal at the first clock rate to a second clock rate and for providing sample points at first and second outputs, respectively, where the differentiator circuit and the integrator circuit comprises a decimation filter; a delay circuit responsive to a first plurality of control signals and coupled between the integrator circuit and the differentiator circuit for providing coarse sampling phase adjustments by delaying the second clock by a predetermined number of first clock cycles; a counter circuit responsive to a second plurality of control signals and to the first clock for providing the second clock to the differentiator circuit and for providing coarse sampling phase adjustments by adding or deleting cycles of the first clock to the second clock; a multiplexer circuit responsive to a first control signal for swapping the first and second outputs of the differentiator circuit at first and second outputs of the multiplexer circuit, and an interpolator circuit responsive to a third plurality of control signals and having first and second inputs coupled to the first and second outputs of the multiplexer circuit, respectively, for providing fine sampling-phase adjustments by interpolation and an output that is transient-error free, the interpolator circuit further includes a bypass circuit coupled to the first and second inputs of the interpolator circuit for bypassing the first output of the multiplexer circuit.

The above and other objects, features, and advantages of the present invention will be better understood from the following detailed description taken in conjunction with the accompanying drawings.

BRIEF DESCRIPTION OF THE DRAWINGS

FIG. 2 is a block diagram illustrating the preferred embodiment of the present invention;

DETAILED DESCRIPTION OF THE INVENTION

Figure 1:
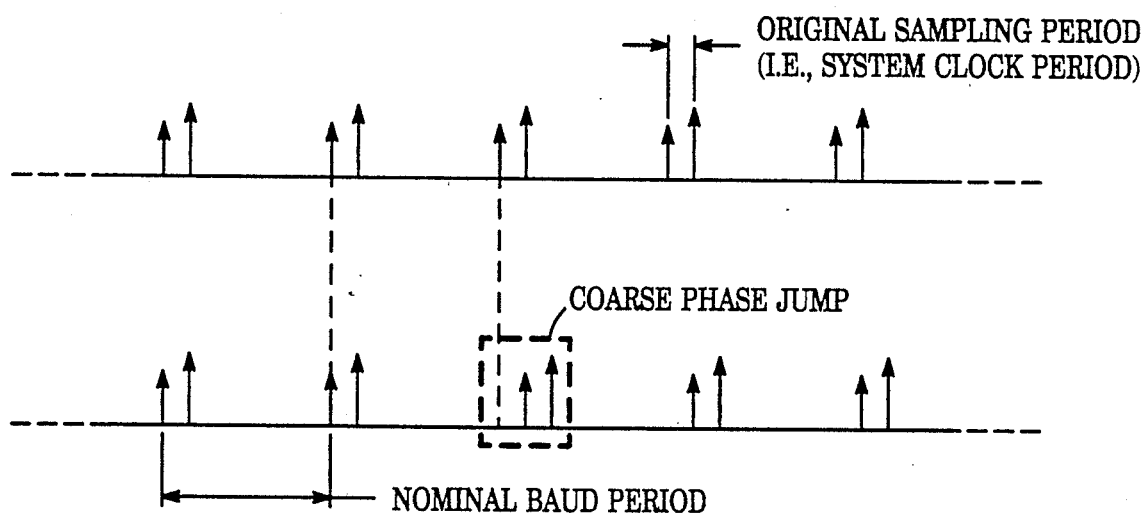
FIG. 1 is a graphical representation of a coarse phase jump.

Referring to FIG. 2, there is illustrated a block diagram of the preferred embodiment of the present invention 10 comprising integrator circuit 12 having an input coupled to input terminal 14 and an output coupled to first and second input terminals of differentiator circuit 16 via switches 15 and 17. Differentiator circuit 16 further has first and second outputs coupled to an multiplexer circuit 18 which is controlled by a select line 20 has a first and second outputs coupled to first and second inputs of an interpolation circuit 22 via delay elements 24 and 26. Interpolation circuit 22 further includes a third input coupled to BYPASS_D1 signal 28 and a fourth input coupled to an interpolation phase variable (C) signal 30 and an output signal 32. The preferred embodiment further comprises coarse phase jump circuitry 33 which includes delay elements 34 and 36 coupled between the output of integrator circuit 12 and the first and second inputs, respectively, of differentiator circuit 16 and has a controller inputs including SEL_m, 29 and SEL_n, 31. Also, the preferred embodiment further comprises a counter circuit 37 coupled to differentiator circuit 16, and is clocked by a SYSTEM CLOCK 39 and has controller inputs including a COARSE_JUMP_EN signal 41, an ADVANCE_PHASE signal 43 and a PRELOAD signal 45 for adding or deleting a system clock cycle delay to the baud clock.

Integrator circuit 12 includes digital integrators 38, 40, and 42. Digital integrator 38 comprises an adder circuit 44 and a delay element 46. An output of adder circuit 44 is connected to a first input or an adder circuit 48 and to an input of delay element 46. An output of delay element 46 is connected to a second input of adder circuit 44 while a first input of adder circuit 44 is connected to input terminal 14. Digital integrator 40 comprises an adder circuit 48 and a delay element 50. An output of adder circuit 48 is connected to a first input of an adder circuit 52 and to an input of delay element 50 which has an output connected to a second input of adder 48. Digital integrator 42 comprises an adder circuit 52 and a delay element 54. An output of adder circuit 52 is connected to the output of integrator circuit 12 and to an input of delay element 54 which has an output connected to a second input of adder circuit 52.

Differentiator circuit 16 comprises digital differentiators 56, 58, 60, 62, 64, and 66. Differentiator 56 includes a subtractor circuit 68 and a delay element 70. The first input of subtractor circuit 68 is connected to the first input of differentiator circuit 16 and to an input of a delay element 70. An output of delay element 70 is connected to a second input of subtractor circuit 68. Differentiator 58 includes a subtractor circuit 72 and a delay element 74. An output of subtractor circuit 68 is connected to a first input of subtractor circuit 72 and to a first input of delay element 74. An output of delay element 74 is connected to a second input of subtractor circuit 72. Differentiator 60 includes subtractor circuit 76 and a delay element 78. An output of subtractor circuit 72 is connected to a first input of subtractor circuit 76 and to an input of delay element 78. An output of delay element 78 is connected to a second input of subtractor circuit 76 while an output of subtractor circuit 76 is connected to the first output of differentiator circuit 16. Furthermore, it is known that differentiators 56, 58 and 60 comprise a comb filter which will be designated as comb filter A. Differentiator 62 includes a subtractor circuit 80 and a delay element 82. A first input of subtractor circuit 80 is coupled to the second input of differentiator circuit 16 and to an input of delay element 82. An output of delay element 82 is connected to a second input of subtractor circuit 80. Differentiator 64 includes a subtractor circuit 84 and a delay element 86. An output of subtractor circuit 80 is connected to a first input of subtractor circuit 84 and to an input of delay element 86. An output of delay element 86 is connected to a second input of subtractor circuit 84. Differentiator 66 includes a subtractor circuit 88 and a delay element 90. An output of subtractor circuit 84 is connected to a first input of subtractor circuit 88 and to an input of delay element 90. An output of delay element 90 is connected to a second input of subtractor circuit 88 while an output of subtractor circuit 88 is connected to the second output of differentiator 16. Furthermore, it is also known that differentiators 62, 64 and 66 comprise a comb filter which will be designated as comb filter B.

In the illustrated form, all delay elements are digital delay circuits. Furthermore, the delay elements in integrator circuit 12 and delay circuit 33 are clocked by a first clock, as denoted by d in FIG. 2, while the delay elements of differentiator circuit 16 are clocked by a second clock (BAUD$_{13}$CLOCK) as denoted by D in FIG. 2. The first clock, typically the system clock, is a slower clock derived from the system clock. Furthermore, Switch 15 and Switch 17 are shown to represent decimation as is understood, such that the frequency of operation before switches 15 and 17 are at the first clock rate, while the frequency of operation after switches 15 and 17 are at the second clock rate.

Interpolator circuit 22 includes a bypass circuit 92 having first and second inputs connected to first and second inputs of interpolation circuit 22, respectively, a third input coupled to controller BYPASS$_{13}$D1 signal 28, a first output connected to a first input of adder circuit 94, and a second output connected to a second input of adder circuit 94 and to a first input of a subtractor circuit 98. The output of adder circuit 94 is connected to a first input of a multiplier circuit 96. A second input of multiplier circuit 96 is coupled to an interpolation phase variable signal 30 while an output of multiplier circuit 96 is connected to a second input of adder circuit 98. Finally, the output of adder circuit 98 is connected to output 32 of interpolation circuit 22.

If the signals at first and second inputs of interpolation circuit 22 are designated to be signals D1 and D2, respectively, as shown in FIG. 2, then one can write a mathematical equation for output 32 of interpolator circuit 22 as:

$$\text{output} = D1 + C*(D2 - D1)$$

From this equation one should realize that if the interpolation-phase variable, C, is substantially equal to zero, then output 32 of interpolation circuit 22 is a function of only signal D1. Furthermore, one of the primary functions of the preferred embodiment 10 is to maintain a transient-error free signal at output 32. Therefore, it should be clear that one can change the sampling phase of the comb filter corresponding to signal D2 and still maintain a transient-error free output 32 if the interpolation phase variable is substantially equal to zero for at least the length of time required to allow the transient errors at signal D2 to die out.

In operation, the input of integrator circuit 12 receives a digital input signal applied at input terminal 14 at the first (system) clock rate. Differentiator circuit 16 down converts the digital signal to a second (baud) clock rate, since differentiator circuit 16 is clocked at the baud rate via BAUD_CLOCK from counter circuit 37, and further provides one sampling point of the original received digital signal per baud cycle per output. Therefore, the first output of differentiator circuit 16 represents sampled data points at the baud rate of the received digital signal at input terminal 14, as generated from comb filter A, and the second output of differentiator circuit 16 represents another set of sampled data points at the baud rate of the received digital input signal at input terminal 14, as generated from comb filter B. These samples data points are sent to multiplexer circuit 18 which has a first output coupled to the first output of differentiator circuit 16, while the second output of multiplexer circuit 18 is coupled to the second output of differentiator circuit 16 when control signal SEL 20 is a logic high, or a first output coupled to the second output of differentiator circuit 16 while the second output of multiplexer circuit 18 is coupled to the first output of differentiator circuit 16 when control signal SEL 20 is a logic low. Therefore, multiplexer circuit 18 is simply a means to swap back and forth the first and the second outputs of differentiator circuit 16 at the first and second outputs of multiplexer circuit 18 as controlled by SEL signal 20 which typically originates from a controller. The first and second outputs of multiplexer circuit 18 are then transmitted to interpolation circuit 22 via delay elements 24 and 26, respectively. Delay elements 24 and 26 merely provide reclocking for timing purposes. Bypass circuit 92 of interpolation circuit 22 is a switch such that if BYPASS_D1 signal 28 is at a logic low, the signal at the first input of bypass circuit 92(D1) is coupled to the second output of bypass circuit 92 while the signal at the second input of bypass circuit 92(D2) is coupled to the first output of bypass circuit 92, however, if BYPASS_D1 signal 28 is a logic high, the signal at the first input of bypass circuit 92(D1) is bypassed while the signal at the second input of bypass circuit 92(D2) is coupled to the first and second outputs of bypass circuit 92. Therefore, if BYPASS_D1 is a logic high, the signal D2 is forced at both first and second outputs thereat. Furthermore, it should be clearly understood by one of ordinary skill in the art how subtractor circuit 94, multiplier circuit 96 and adder circuit 98 are used to produce the aforementioned output signal at output 32 of interpolation circuit 22.

In addition, delay circuit 33 is programmable to control the baud-clock delay of the first and second comb filters by 0, 1 or 2 system cycles by adjusting the values of n and m of delay elements 34 and 36, respectively, by 0, 1, or 2, via control signals SEL_m and SEL_n. Also, it should be understood tat one can effectively add or delete a system clock clock cycle to the baud clock by adjusting the PRE-LOAD signal 45 of counter circuit 37. Therefore, it should be clear that there has been described two different techniques for delaying the baud clock with respect to the system clock which will be utilized to perform coarse phase jumps. Furthermore, delay circuit 33 and counter circuit 37 are two implementations for delaying the baud clock with respect to the system clock; however, it should be clear that they are not the only possible implementations.

As aforementioned, one of the main functions of the preferred embodiment 10 is to be able to change the sampling phase of the comb filters of differentiator circuit 16 while maintaining an error-free signal at output 32 of interpolation circuit 22. FIGS. 3 through 6 illustrate the four possible coarse phase jump scenarios that may occur. Four diagrams are necessary since the control operations required for a particular type of jump are dependent upon the type of jump made previously. For example, FIG. 3 indicates how a coarse advance jump would be executed when the previous coarse jump was also an advance coarse jump. Furthermore, FIG. 4 indicates how a coarse retard phase jump would be executed when the previous coarse jump was an advance coarse jump, and so on for FIGS. 5 and 6. In each case, the interpolation phase constant, C, is assumed to range from 0.0 to 0.99 with a resolution of 0.01. As can be seen from FIGS. 3 through 6, a coarse advance phase jump is required when the interpolation phase constant is incremented and rolls over from 0.99 to 0.0 and a coarse retard phase jump is required when the interpolation phase constant is decremented and rolls over from 0.0 to 0.99.

Figure 3A:
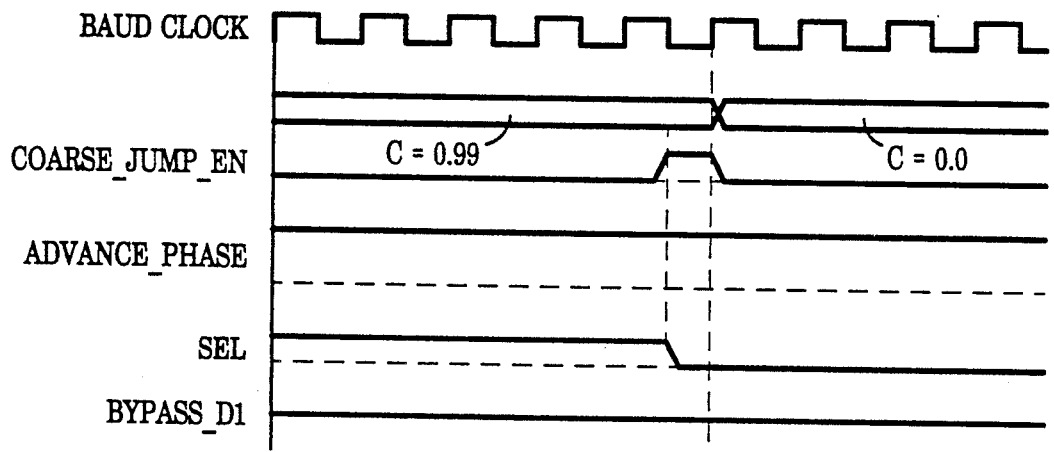
FIGS. 3A–3C are a graphical representation of an advance-advance coarse phase jump.
Figure 3B:
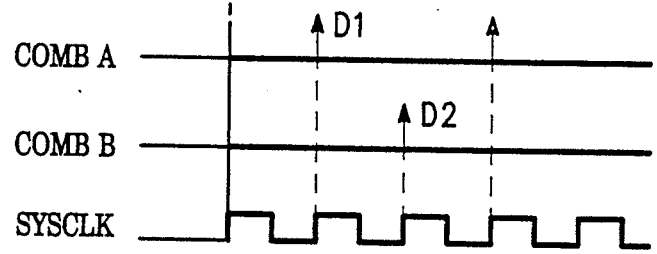
Figure 3C:
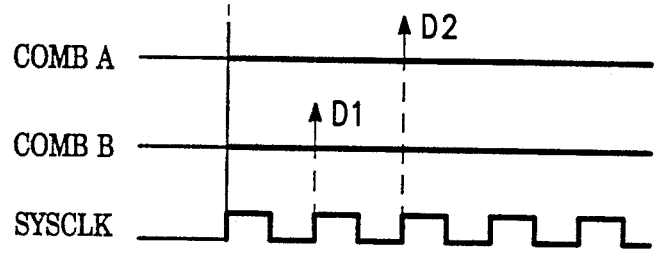

Referring to FIG. 3, there is illustrated a graphical representation of an advance-advance coarse phase jump where FIG. 3A shows the logic levels of various control signals, FIG. 3B shows the respective sampling phases of comb filters A and B before a coarse phase jump and FED. 3C shows the respective sampling phases of comb filters A and B after a coarse phase jump. It is worth noting in FIG. 3, as well as FIGS. 4–6, that although the time scale for FIGS. 3A and 3B as well as for FIGS. 3A and 3C look similar, they are quite different because the waveforms of FIG. 3A are referenced with respect to the baud clock while the waveforms of FIGS. 3B and 3C are referenced with respect to the system clock as shown.

In FIG. 3B, the outputs of comb filters A and B are designated by D1 and D2, respectively, are shown which corresponds to SEL signal 20 being a logic high. Assume the starting sampling phases as shown where the output of comb A is sampling at the baud rate delayed by one system clock cycle while comb B is sampling at the baud rate delayed by two system clock cycles. This corresponds to value of n=1 and m=2 for delay element 34 and 36, respectively, as set by control signals SEL_n, 31, and SEL_m, 29. Assume it is desired to be sampling at the phase of D2 and the anticipated sampling phase as shown in FIG. 3B. This involves maintaining the sampling phase of comb filter B and advancing the sampling phase of comb filter A by two system clock cycles. Referring to the equation for output 32 of interpolation circuit 22, if the interpolator phase variable, C, 30, is substantially equal to zero, then output 32 is a function of D1 only, and one would be allowed to vary the sampling phase of the comb filter corresponding to signal D2 without producing any transient errors at output 32. This is implemented by swapping the outputs of comb filters A and B by multiplexer circuit 18 by SEL signal 20 going low while C is substantially equal to 0.99, as shown in FIG. 3A, and then advancing the sampling phase of comb filter A, now at signal D2, by two system clock cycles. Note that when SEL signal 20 is at a logic high, then the output of comb filter A is signal D1 while the output of comb filter B is at signal D2; however, when the SEL signal 20 is a logic low, then the output of comb filter A is at D2 while the output of comb filter B is at D1. Furthermore, ADVANCE_PHASE signal 43 goes high to indicate that an advance coarse phase jump is desired as shown in FIG. 3A. However, since comb filter A was initially delayed by one system clock cycle and delay circuit 33 can only be programmed to delay the baud clock by 0, 1 or 2 system clock cycles, an extra cycle must be added to the baud clock to obtain the proper delay for comb filter A. This is implemented by counter circuit 37. Counter circuit 37 is clocked by SYSTEM CLOCK 39 and outputs the baud clock to clock differentiator circuit 16. Therefore, by varying PRELOAD signal 45 and forcing COARSE_JUMP_EN SIGNAL 41 to a logic high as shown in FIG. 3A, the baud clock can be adjusted by a predetermined amount of system clock cycles. Furthermore, since the sampling phase of comb filter B must be preserved, comb filter B of differentiator circuit 16 must be adjusted to account for the added system clock cycle from counter circuit 37. Therefore, delay element 36 will provide one less system clock cycle delay by changing the value of m from 2 to 1 via SEL_m signal 29. Thus, since a system clock cycle was added by counter circuit 37 and a system clock cycle delay was subtracted by delay element 36, the sampling phase of comb filter B remains constant, and a transient error will not occur at output 32 of interpolator circuit 22. Once the sampling phase of comb filter A has settled out, at lest 3 baud clock cycles for the circuit shown in FIG. 2, one will be able to interpolate between the new sampling interval of comb filters A and B as shown in FIG. 3C by D2 and D1, respectively. It is worth noting that at first glance of FIGS. 3B and 3C, one might conclude that the outputs of comb filters A and B have simply been swapped and the interval for interpolation has not changed. However, it is important to realize that an extra system clock cycle has been added to the baud clock; thus, the interval encompassed by comb filters A and B of FIG. 3C is indeed one system clock cycle ahead (advanced) than the interval encompassed by comb filters A and B in FIG. 3B. Therefore, a successful advance-advance coarse phase jump has been performed with the use of only two comb filters, while maintaining a transient-error free output 32 of interpolator circuit 22.

Figure 4A:
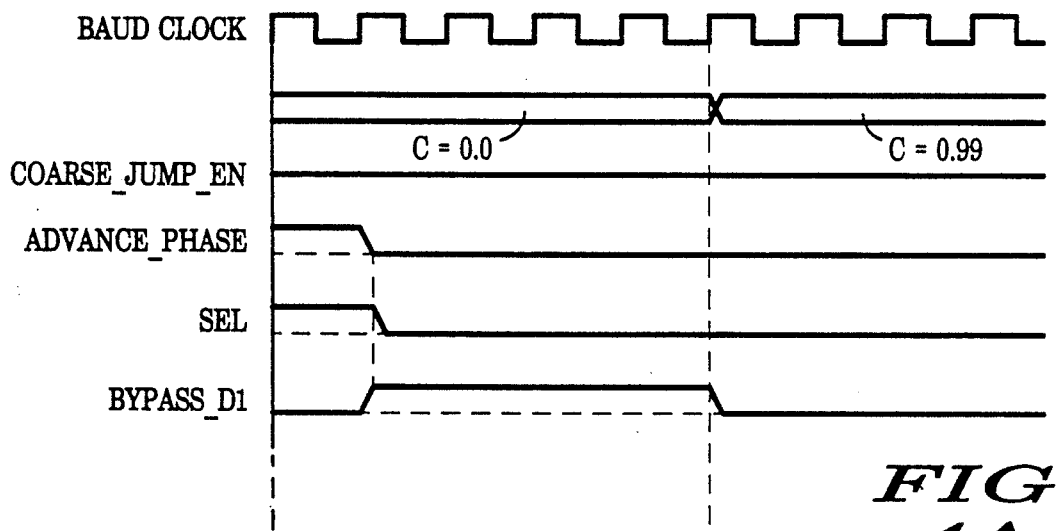
FIGS. 4A–4C are graphical representation of an advance-retard coarse phase jump.
Figure 4B:
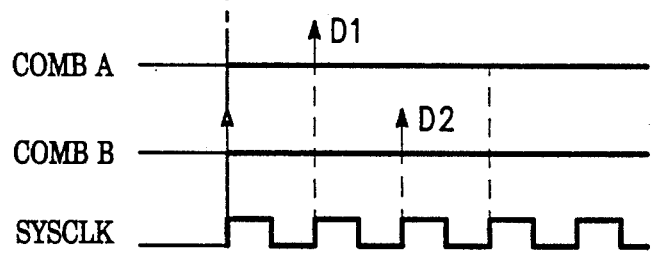
Figure 4C:
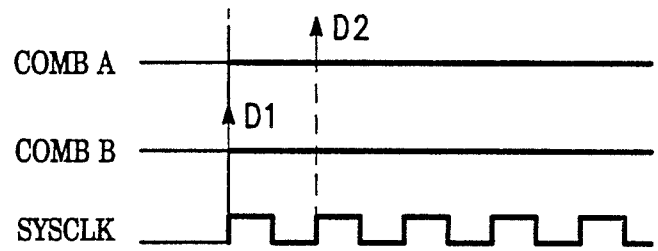

Referring to FIG. 4, there is illustrated a graphical representation of an advance-retard coarse phase jump where FIG. 4A shows the logic levels of various control signals, FIG. 4B shows the respective sampling phases of comb filters A and B before a coarse phase jump, and FIG. 4C shows the respective sampling phases of comb filters A and B after a coarse phase jump. FIG. 4B shows the outputs of comb filters A and B as designated by D1 and D2, respectively, after an advance phase jump was executed. It is important to realize that since FIGS. 3B and 3C are mirror images of each other, and both display the two possible relationships between comb filters A and B after an advance phase jump has been executed, we could assure the initial sampling phase for FIG. 4B as either one. Therefore, for simplicity, assume the starting sampling phases as shown in FIG. 4B where the output of comb A, at signal D1, is sampling at the baud rate delayed by one system clock cycle, while comb B, at signal D2, is sampling at the baud rate delayed by two system clock cycles. This again corresponds to SEL signal 20 being a logic high and a value of n=1 and m=2 for delay elements 34 and 36, respectively. Assume it is desired to be sampling at the phase of D1 and the anticipated sampling phase as shown in FIG. 4B. This involves maintaining the sampling phase of comb filter A and retarding the sampling phase of comb filter B by two system-clock cycles, This is implemented by swapping the outputs of comb filters A and B by forcing SEL signal 20 to a logic low and simultaneously bypassing comb filter B by applying a logic high to BYPASS_D1 signal 28 when signal C,30, is substantially equal to zero as shown in FIG. 4A. Since BYPASS_D1 signal 28 is high, the output of comb filter A, at signal D2, is also present at both outputs of bypass circuit 92 thereby making output 32 of interpolation circuit 22 substantially equal to the signal at D2 for C substantially equal to zero. This allows comb filter B, which is the signal that is presently being bypassed at D1, to be retarded by two system clock cycles by changing the values of m from 2 to 0 in delay element 36 via SEL_m signal 29. Note that this coarse phase jump did not require a change in counter circuit 37, since the required two delays were accounted for by delay element 36; therefore, COARSE_JUMP_EN SIGNAL 41 remained at a logic low. Furthermore, ADVANCE_PHASE signal 43 also remained at a logic low, since a retard coarse phase jump was performed. Once the sampling phase of comb filter B has settled out, C can be changed from 0.0 to 0.99. The resulting sampling phases for comb filters A and B are shown in FIG. 4C. Note that the sampling phase of comb filter A has remained constant, and while the sampling phase of comb filter B has been retarded by two system clock cycles. Thus, the interval encompassed by comb filters A and B of FIG. 4C is indeed one system clock cycle behind (retarded) than the interval encompassed by comb filters A and B in FIG. 4B. Therefore, a successful advance-retard coarse phase jump has been performed with the use of only two comb filters while maintaining a transient-error free output 32 of interpolator circuit 22.

Figure 5A:
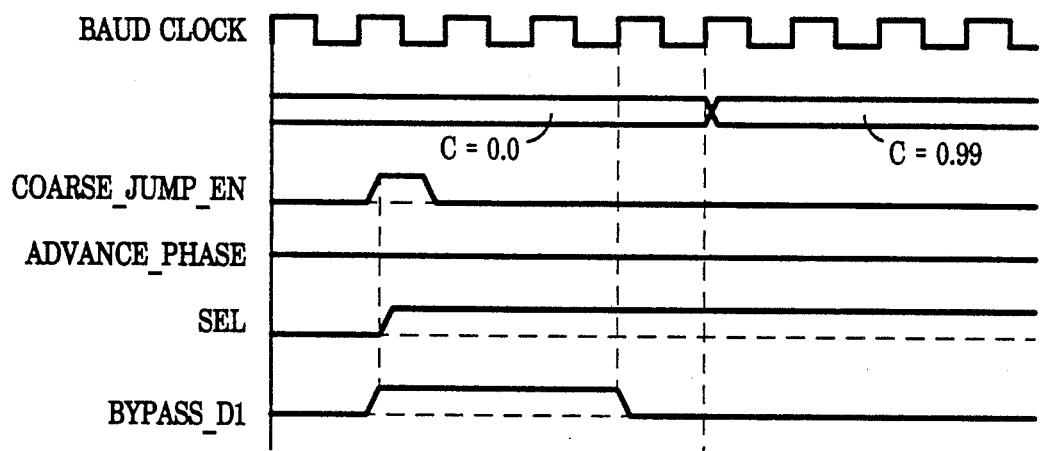
FIGS. 5A–5C are graphical representation of a retard-retard coarse phase jump.
Figure 5B:
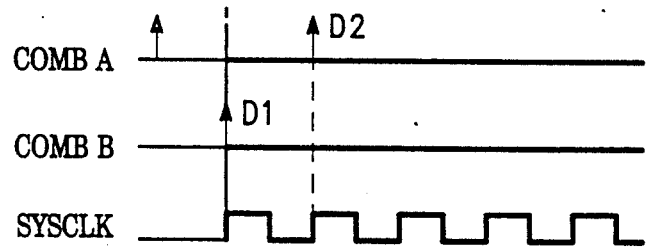
Figure 5C:
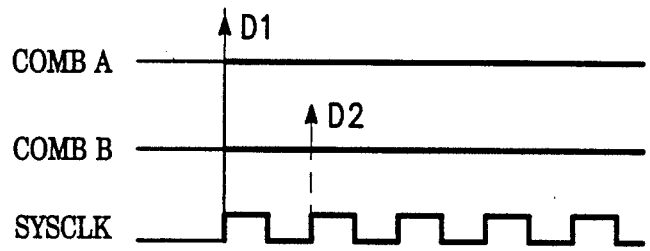

Referring to FIG. 5, there is illustrated a graphical representation of a retard-retard coarse phase jump where FIG. 5A shows a logic levels of various control signals, FIG. 5B shows the respective sampling phases of comb filters A and B before a coarse phase jump and FIG. 5C shows the respective sampling phases of comb filters A and B after a coarse phase jump. FIG. 5B shows the outputs of comb filters A and B as designated by D2 and D1, respectively, after a retard phase jump was executed. Again, there are two possible phase relationships between comb filters A and B after a retard coarse phase jump, but for simplicity, assume the starting sampling phases as shown in FIG. 5B where the output of comb A at signal D2 is sampling at the baud rate delayed by one system clock cycle, while comb B at signal D1 is sampling at the baud rate delayed by zero system clock cycles. This corresponds to SEL signal 30 being a logic low and to a value of n=1 and m=0 for delay elements 34 and 36, respectively. Assume it is desired to be sampling at the phase of D1 and the anticipated sampling phase as shown in FIG. 5B. This involves maintaining the sampling phase of comb filter B and retarding the sampling phase of comb filter A by two system clock cycles. This is implemented by swapping the outputs of comb filters A and B by forcing a logic high to SEL signal 20 and simultaneously bypassing comb filter A by applying a logic high to BYPASS-_D1 signal 28 when signal C,30, is substantially equal to zero as shown in FIG. 5A. Since BYPASS_D1 signal 28 is high, the output of comb filter B, at signal D2, is also present at both outputs of bypass circuit 92, thereby making output 32 of interpolation circuit 22 substantially equal to the signal at D2 for C substantially equal to zero. This allows comb filter A, which is the signal that is presently being bypassed at D1, to be retarded by two system clock cycles. However, since comb filter A was initially delayed by one system-clock cycle and delay circuit 33 can only be programmed to delay the baud clock by 0, 1 or 2 system clock cycles, an extra cycle must be deleted to the baud clock to obtain the proper delay for comb filter A. This two system-clock delay is implemented by changing the value of n from 1 to 0 via control SEL_n signal 31, which accounts for one delay and counter circuit 37, which can be loaded with predetermined value such that a system-clock cycle can be deleted to account for the second delay as shown by COARSE_JUMP_EN signal 41 going to a logic high in FIG. 5A. Furthermore, since the sampling phase of comb filter B must be preserved, the sampling phase of comb filter B must be adjusted to account for the deleted system clock cycle from counter circuit 37. Therefore, delay element 36 will provide one more system clock cycle delay by changing the value of m from 0 to 1 via control SEL_m signal 29. Thus, since a system-clock cycle was deleted by counter circuit 37 and a system-clock cycle delay was added by delay element 36, the sampling phase of comb filter B remains constant and a transient error will not occur at output 32 of interpolation circuit 22. Once the sampling phase of comb filter A has settled out, C can then be changed from 0.0 to 0.99. The resulting sampling phases for comb filters A and B are shown in FIG. 5C. It must be realized that since a system-clock cycle was deleted, the sampling phase of comb filter B has remained constant while the sampling phase of comb filter A has been retarded by two system-clock cycles. Thus, the interval encompassed by comb filters A and B of FIG. 5C is indeed one system-clock cycle behind (retard) than the interval encompassed by comb filters A and B in FIG. 5B. Therefore, a successful retard-retard coarse phase jump has been performed with the use of only two comb filters while maintaining a transient-error free output 32 of interpolation circuit 22.

Figure 6A:
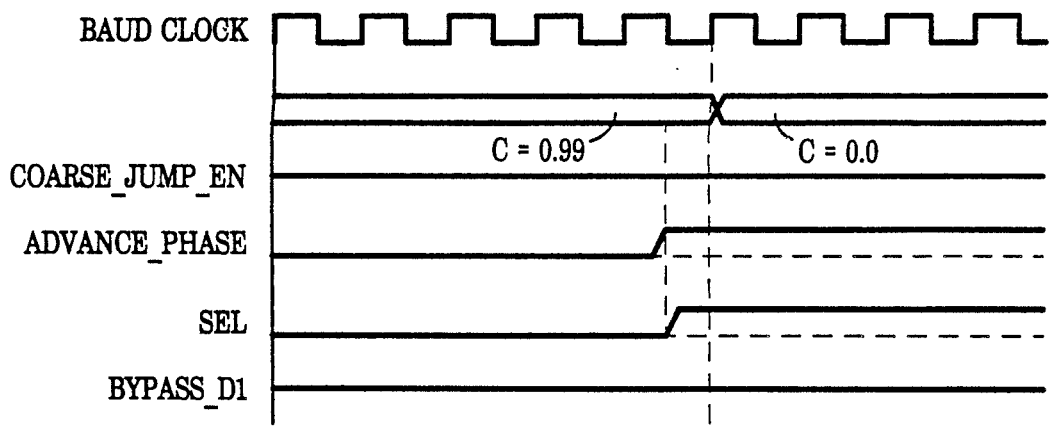
FIGS. 6A–6C are graphical representation of a retard-advance coarse phase jump.
Figure 6B:
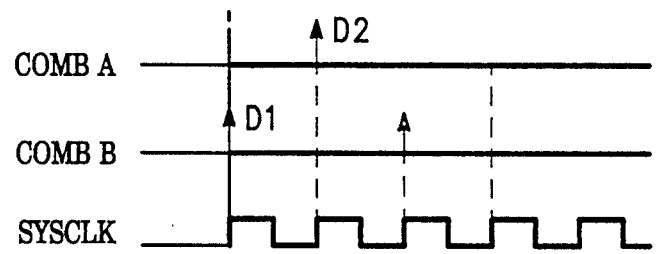
Figure 6C:
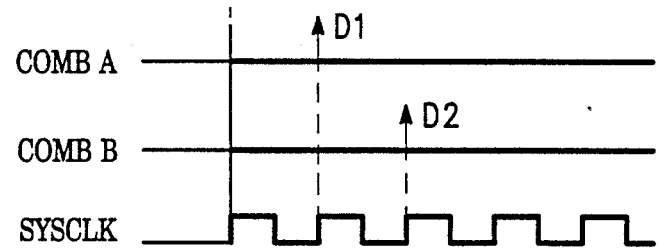

Referring to FIG. 6, there is illustrated a graphical representation of a retard-advance coarse phase jump where FIG. 6A shows the logic levels of various control signals, FIG. 6B shows the respective sampling phases of comb filters A and B before a coarse phase jump and FIG. 6C shows the respective sampling phases of comb filters A and B after a coarse phase jump. FIG. 6B shows the outputs of comb filters A and B as designated by D2 and D1, respectively, after a retard phase jump was executed. Again, there are two possible phase relationships between comb filters A and B after a retard coarse phase jump, but for simplicity, assume the starting sampling phases as shown in FIG. 6B where the output of comb filter A, at signal D2, is sampling at the baud rate delayed by one system clock cycle while comb filter B, at signal D1, is sampling at the baud rate delayed by zero system-clock cycles. This corresponds to SEL signal 30 being a logic low and to a value of n=1 and m=0 for delay elements 34 and 36, respectively. Assume it is desired to be sampling at the phase of D2 and the anticipated sampling phase as shown in FIG. 6B. This involves maintaining the sampling phase of comb filter A and advancing the sampling phase of comb filter B by two system-clock cycles. This is implemented by swapping the outputs of comb filters A and B by multiplexer circuit 18 by SEL signal 20 going high while C is substantially equal to 0.99 and then advancing the sampling phase of comb filter B by two system-clock cycles by changing the value of m from 0 to 2 in delay element 36 via SEL_m signal 29. Note that this coarse phase jump did not require a change in counter circuit 37, since the required two delays were accounted for by delay element 36; therefore, COARSE_JUMP_EN SIGNAL 41 remained at a logic low. Furthermore, ADVANCE_PHASE signal 43 went to a logic high since an advance coarse phase jump was performed. Once the sampling phase of comb filter B has settled out, one will be able to interpolate between the new sampling interval of comb filters A and B as shown in FIG. 6C by D1 and D2, respectively, and signal C can be rolled over to be substantially equal to zero. It should now be clear that the interval encompassed by comb filters A and B of FIG. 6C is indeed one system-clock cycle ahead (advanced) of the interval encompassed by comb filters A and B in FIG. 6B. Therefore, a successful retard-advance coarse phase jump has been performed with the use of only two comb filters while maintaining a transient-error free output 32 of the interpolation circuit 22.

By now it should be appreciated that there has been provided a novel transient-error free interpolating decimator having a transient-error free output by utilizing only two comb filters.

What is claimed is:

1. A transient-error free interpolating decimator utilizing only two comb filters, comprising:
   integrator means for receiving a digital input signal at a first clock;
   counter means responsive to a first plurality of control signals and to said first clock for providing a second clock and for providing coarse sampling phase jumps by adding or deleting cycles of said first clock to said second clock;
   delay means responsive to a second plurality of control signals and coupled to said integrator means for providing coarse sampling phase jumps by delaying said second clock by a predetermined number of first clock cycles;
   differentiator means coupled to said delay means and to said second clock and having first and second comb filters operating at said second clock for providing sample points at first and second outputs respectively;
   multiplexor means responsive to a first control signal for swapping said first and second outputs of said differentiator means at first and second outputs of said multiplexer means; and
   interpolator means responsive to a third plurality of control signals and having first and second inputs coupled to said first and second outputs of said multiplexer means, respectively, for providing fine sampling phase adjustments by interpolation and an output that is transient-error free, said interpolator means includes bypass means coupled to said first and second inputs of said interpolator means for bypassing said first input of said interpolator means.

2. The transient-error free interpolating decimator according to claim 1 wherein said interpolator means further comprises:
   a subtractor circuit having a first input coupled to said bypass means, a second input coupled to said first input of said interpolator means and an output;
   a multiplier circuit having a first input coupled to said output of said subtractor circuit, a second input coupled to one of said third plurality of control signals for varying a predetermined interpolation function implemented by the interpolator means, and an output; and an adder circuit having a first input coupled to said output of said multiplier circuit, a second input coupled to said first input of said interpolator means and an output coupled to said output of said interpolator means.

3. The transient-error free interpolating decimator according to claim 1 further comprising:

a first delay circuit coupled between said first output of said multiplexer means and said first input of said interpolator means; and a second delay circuit coupled between said second output of said multiplexer means and said second input of said interpolator means.

4. A transient-error free interpolating decimator utilizing only two comb filters, comprising:

integrator means for receiving a digital input signal at a first clock;

differentiator means having first and second comb filters for down converting said digital input signal at said first clock to a second clock and for providing sample points at first and second outputs, respectively; wherein the improvement comprises:

counter means responsive to a first plurality of control signals and to said first clock for providing said second clock to said differentiator means and for providing coarse sampling phase jumps by adding or deleting cycles of said first clock to said second clock;

delay means responsive to a first control signal and coupled between said integrator means and said differentiator means for providing coarse sampling phase jumps by delaying said second clock by a predetermined number of first clock cycles;

multiplexer means coupled to the first and second outputs of the differentiator means and responsive to a first control signal for swapping said first and second outputs of said differentiator means at first and second outputs of said multiplexer means; and interpolator means responsive to a third plurality of control signals and having first and second inputs coupled to said first and second outputs of said multiplexer means, respectively, for providing fine sampling phase adjustments by interpolation and an output that is transient-error free, said interpolation means includes bypass means coupled to said first and second inputs of said interpolator means for bypassing said first output of said multiplexer means.

5. The transient-error free interpolating decimator according to claim 4 wherein said interpolator means further comprises:

a subtractor circuit having a first input coupled to said bypass means, a second input coupled to said first input of said interpolator means and an output;

a multiplier circuit having a first input coupled to said output of said subtractor circuit, a second input coupled to one of said third plurality of control signals for varying a predetermined interpolation function implemented by the interpolator means, and an output; and an adder circuit having a first input coupled to said output of said multiplier circuit, a second input coupled to said first input of said interpolator means and an output coupled to said output of said interpolator means.

6. The transient-error free interpolating decimator according to claim 4 further comprising:

a first delay circuit coupled between said first output of said multiplexer means and said first input of said interpolator means; and a second delay circuit coupled between said second output of said multiplexer means and said second input of said interpolator means.

* * * * *